US007257231B1

(12) United States Patent
Avendano et al.

(10) Patent No.: US 7,257,231 B1
(45) Date of Patent: Aug. 14, 2007

(54) STREAM SEGREGATION FOR STEREO SIGNALS

(75) Inventors: Carlos M. Avendano, Campbell, CA (US); Jean-Marc M. Jot, Aptos, CA (US)

(73) Assignee: Creative Technology Ltd., Singapore (SG)

( * ) Notice: Subject to any disclaimer, the term of this patent is extended or adjusted under 35 U.S.C. 154(b) by 803 days.

(21) Appl. No.: 10/163,168

(22) Filed: Jun. 4, 2002

(51) Int. Cl.
*H03G 5/00* (2006.01)

(52) U.S. Cl. .................................................. 381/99

(58) Field of Classification Search .................... 381/1, 381/2, 99
See application file for complete search history.

(56) References Cited

U.S. PATENT DOCUMENTS

| | | | |
|---|---|---|---|
| 5,666,424 A | 9/1997 | Fosgate et al. | |
| 5,890,125 A | 3/1999 | Davis et al. | |
| 6,021,386 A | 2/2000 | Davis et al. | |
| 6,405,163 B1 | 6/2002 | Laroche | 704/205 |
| 6,430,528 B1 | 8/2002 | Jourjine et al. | |
| 2003/0026441 A1* | 2/2003 | Faller | 381/98 |

FOREIGN PATENT DOCUMENTS

WO PCT/US00/26601 4/2001

OTHER PUBLICATIONS

Allen, et al, "Multimicrophone signal-processing technique to remove room reverberation from speech signals" J. Accoust. Soc. Am., vol. 62, No. 4, Oct. 1977, p. 912-915.

Avendano Carlos, et al, "Ambience Extraction and Synthesis from Stereo Signals for Multi-Channel Audio Up-Mix", IEEE Int'l Conf. On Acoustics, Speech & Signal Processing, May 2002.

Avendano Carlos, et al, "Frequency Domain Techniques for Stereo to Multichannel Upmix", AES 22nd International Conference on Virtual, Synthetic and Entertainment Audio.

Baumgarte, Frank, et al, "Estimation of Auditory Spatial Cues for Binaural Cue Coding", IEEE Int'l. Conf. On Acoustics, Speech and Signal Processing, May 2000.

Begault, Durand R., "3-D Sound for Virtual Reality and Multimedia", A P Professional, p. 226-229.

Blauert, Jens, "Spatial Hearing The Psychophysics of Human Sound Localization", The MIT Press, pp. 238-257.

Dressler, Roger, "Dolby Surround Pro Logic II Decoder Principles of Operation", Dolby Laboratories, Inc., 100 Potrero Ave., San Francisco, CA 94103.

Faller, Christof, et al, "Binural Cue Coding: A Novel and Efficient Representation of Spatial Audio", IEEE Int'l. Conf. On Acoustics, Speech & Signal Processing, May 2002.

(Continued)

*Primary Examiner*—Curtis Kuntz
*Assistant Examiner*—Alexander Jamal
(74) *Attorney, Agent, or Firm*—Van Pelt, Yi & James LLP

(57) ABSTRACT

Separating a source in a stereo signal having a left channel and a right channel includes transforming the signal into a short-time transform domain; computing a short-time similarity measure between the left channel and the right channel; classifying portions of the signals having similar panning coefficients according to the short-time similarity measure; segregating a selected one of the classified portions of the signals corresponding to the source; and reconstructing the source from the selected portions of the signals.

27 Claims, 8 Drawing Sheets

OTHER PUBLICATIONS

Gerzon, Michael A., "Optimum Reproduction Matrices for Multispeaker Stereo", J. Audio Eng. Soc., vol. 40, No. 78, Jul. Aug. 1992.

Holman, Tomlinson, "Mixing the Sound" Surround Magazine, p. 35-37, Jun. 2001.

Jot, Jean-Marc, et al, "A Comparative Study of 3-D Audio Encoding and Rendering Techniques", AES 16th Int'l. Conf. On Spatial Sound Reproduction, Rovaniemi, Finland 1999.

Kyriakakis, C., et al, "Virtual Microphones for Multichannel Audio Applications" In Proc. IEEE ICME 2000, vol. 1, pp. 11-14, Aug. 2000.

Miles, Michael T., "An Optimum Linear-Matrix Stereo Imaging system." AES 101st Convention, 1996, preprint 4364 (J-4).

Pulkki, Ville, et al, "Localization of Amplitude-Panned Virtual Sources I: Stereophonic Panning", J. Audio Eng. Soc., vol. 49, No. 9, Sep. 2002.

Rumsey, Francis, "Controlled Subjective Assessments of Two-to-Five-Channel Surround Sound Processing Algorithms", J. Audio Eng. Soc., vol. 47, No. 7/8, Jul./Aug. 1999.

Schoeder, Manfred R., "An Artificial Stereophonic Effect Obtained from a Single Audio Signal", Journal of the Audio Engineering Society, vol. 6, pp. 74-79, Apr. 1958.

Jourjine et al., Blind Separation of Disjoint Orthogonal Signals: Demixing N Sources from 2 Mixtures, IEEE International Conference on Acoustics, Speech and Signal Processing, vol. 5, pp. 2985-2988, Apr. 2000.

Eric Lindemann, Two Microphone Nonlinear Frequency Domain Beamformer for Hearing Aid Noise Reduction, In Proc. IEEE ASASP Workshop on app. of sig. Proc. to audio and acous., New Paltz NY 1995.

Baumgarte et al., Estimation of Auditory Spatial Cues for Binaural Cue Coding, IEEE International Conference on Acoustics, Speech and Signal Processing, May 2002.

Allen, et al, "Multimicrophone signal-processing technique to remove room reverberation from speech signals" J. Accoust. Soc. Am., vol. 62, No. 4, 1977, pp. 912-915.

Avendano Carlos, et al, "Ambience Extraction and Synthesis from Stereo Signals for Multi-Channel Audio Up-Mix", IEEE Int'l Conf. On Acoustics, Speech & Signal Processing, May 2002.

Avendano Carlos, et al, "Frequency Domain Techniques for Stereo to Multichannel Upmix", AES 22nd International Conference on Virtual, Synthetic and Entertainment Audio no date provided.

Baumgarte, Frank, et al, "Estimation of Auditory Spatial Cues for Binaural Cue Coding", IEEE Int'l. Conf. On Acoustics, Speech and Signal Processing, May 2000.

Begault, Durand R., "3-D Sound for Virtual Reality and Multimedia", A P Professional, pp. 226-229. no date provided.

Blauert, Jens, "Spatial Hearing The Psychophysics of Human Sound Localization", The MIT Press, pp. 238-257. no date provided.

Dressler, Roger, "Dolby Surround Pro Logic II Decoder Principles of Operation", Dolby Laboratories, Inc., 100 Potrero Ave., San Francisco, CA 94103. no date provided.

Faller, Christof, et al, "Binural Cue Coding: A Novel and Efficient Representation of Spatial Audio", IEEE Int'l. Conf. On Acoustics, Speech & Signal Processing, May 2002.

Gerzon, Michael A., "Optimum Reproduction Matrices for Multispeaker Stereo", J. Audio Eng. Soc., vol. 40, No. 78, Jul. Aug. 1992.

Holman, Tomlinson, "Mixing the Sound" Surround Magazine, pp. 35-37, Jun. 2001.

Jot, Jean-Marc, et al, "A Comparative Study of 3-D Audio Encoding and Rendering Techniques", AES 16th Int'l. Conf. On Spatial Sound reproduction, Rovaniemi, Finland 1999.

* cited by examiner

Low Frequencies (f<700 Hz)

High Frequencies (f>700 Hz)

STREAM SEGREGATION FOR STEREO SIGNALS

FIELD OF THE INVENTION

The present invention relates generally to audio signal processing. More specifically, stream segregation for stereo signals is disclosed.

BACKGROUND OF THE INVENTION

While surround multi-speaker systems are already popular in the home and desktop settings, the number of multichannel audio recordings available is still limited. Recent movie soundtracks and some musical recordings are available in multi-channel format, but most music recordings are still mixed into two channels and playback of this material over a multi-channel system poses several questions. Sound engineers mix stereo recordings with a very particular set up in mind, which consists of a pair of loudspeakers placed symmetrically in front of the listener. Thus, listening to this kind of material over a multi-speaker system (e.g. 5.1 surround) raises the question as to what signal or signals should be sent to the surround and center channels. Unfortunately, the answer to this question depends strongly on individual preferences and no clear objective criteria exist.

There are two main approaches for mixing multi-channel audio. One is the direct/ambient approach, in which the main (e.g. instrument) signals are panned among the front channels in a frontally oriented fashion as is commonly done with stereo mixes, and "ambience" signals arc sent to the rear (surround) channels. This mix creates the impression that the listener is in the audience, in front of the stage (best seat in the house). The second approach is the "in-the-band" approach, where the instrument and ambience signals are panned among all the loudspeakers, creating the impression that the listener is surrounded by the musicians. There is an ongoing debate about which approach is the best.

Whether an in-the-band or a direct/ambient approach is adopted, there is a need for better signal processing techniques to manipulate a stereo recording to extract the signals of individual instruments as well as the ambience signals. This is a very difficult task since no information about how the stereo mix was done is available in most cases.

The existing two-to-N channel up-mix algorithms can be classified in two broad classes: ambience generation techniques which attempt to extract and/or synthesize the ambience of the recording and deliver it to the surround channels (or simply enhance the natural ambience), and multichannel converters that derive additional channels for playback in situations when there are more loudspeakers than program channels. In the latter case, the goal is to increase the listening area while preserving the original stereo image. Multichannel converters can be generally categorized in the following classes:

1) Linear matrix converters, where the new signals are derived by scaling and adding/subtracting the left and right signals. Mainly used to create a 2-to-3 channel up-mix, this method inevitably introduces unwanted artifacts and preservation of the stereo image is limited.

2) Matrix steering methods which are basically dynamic linear matrix converters. These methods are capable of detecting and extracting prominent sources in the mix such as dialogue, even if they are not panned to the center. Gains are dynamically computed and used to scale the left and right channels according to a dominance criterion. Thus a source (or sources) panned in the primary direction can be extracted. However, this technique is still limited to looking at a primary direction, which in the case of music might not be unique.

While the techniques described above have been of some use, there remains a need for better signal processing techniques for multichannel conversion and developing better techniques for manipulating existing stereo recordings to be played on a multispeaker system remains an important problem.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION

Figure 1:
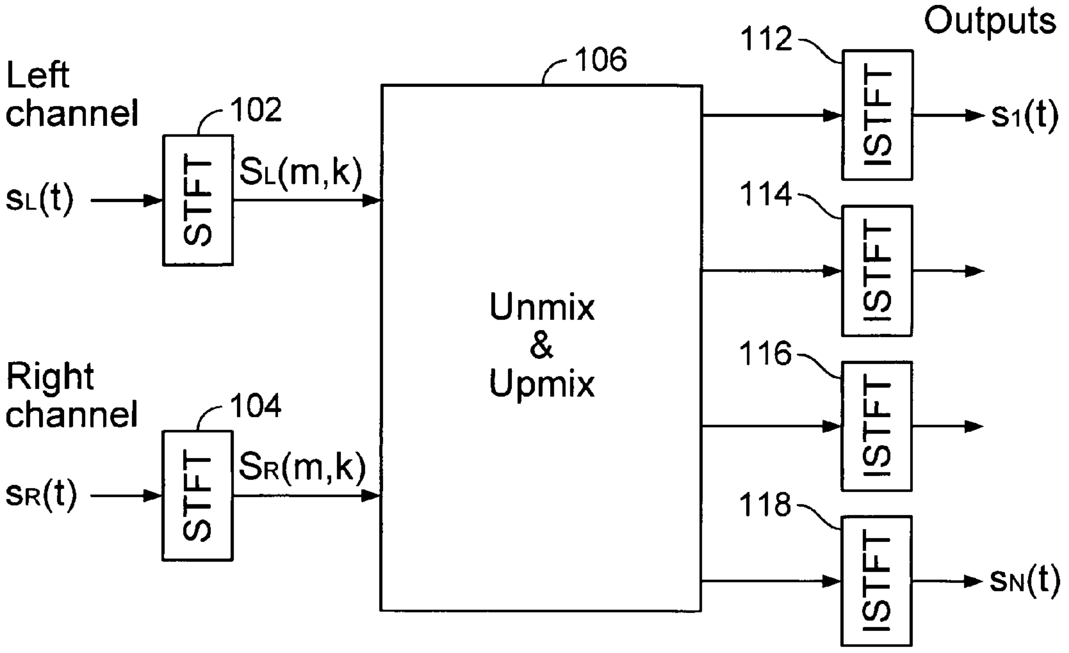
FIG. 1 is a block diagram illustrating how upmixing is accomplished in one embodiment.

It should be appreciated that the present invention can be implemented in numerous ways, including as a process, an apparatus, a system, or a computer readable medium such as a computer readable storage medium or a computer network wherein program instructions are sent over optical or electronic communication links. It should be noted that the order of the steps of disclosed processes may be altered within the scope of the invention.

A detailed description of one or more preferred embodiments of the invention are provided below along with accompanying figures that illustrate by way of example the principles of the invention. While the invention is described in connection with such embodiments, it should be understood that the invention is not limited to any embodiment. On the contrary, the scope of the invention is limited only by the appended claims and the invention encompasses numerous alternatives, modifications and equivalents. For the purpose of example, numerous specific details are set forth in the following description in order to provide a thorough understanding of the present invention. The present invention may be practiced according to the claims without some or all of these specific details. For the purpose of clarity, technical material that is known in the technical fields related to the invention has not been described in detail so that the present invention is not unnecessarily obscured.

Stereo Recording Methods

It is possible to use certain knowledge about how audio engineers record and mix stereo recordings to derive information from the recordings. There are many ways of recording and mixing a musical performance, but we can roughly categorize them into two classes. In the first class, or studio recording, the different instruments are recorded in individual monaural signals and then mixed into two channels. The mix generally involves first panning in amplitude the monaural signals individually so as to position each instrument or set of instruments in a particular spatial region in front of the listener (in the space between the loudspeakers). Then, ambience is introduced by applying artificial stereo reverberation to the pre-mix. In general, the left and right impulse responses of the reverberation engine are mutually de-correlated to increase the impression of spaciousness. In this description, we refer to two channel signals as left and right for the purpose of convenience. It should be noted that the distinction is in some cases arbitrary and the two signals need not actually represent right and left stereo signals.

The second class, or live recording, is done when the number of instruments is large such as in a symphony orchestra or a jazz big band, and/or the performance is captured live. Generally, only a small number of spatially distributed microphones are used to capture all the instruments. For example, one common practice is to use two microphones spaced a few centimeters apart and placed in front of the stage, behind the conductor or at the audience level. In this case the different instruments are naturally panned in phase (time delay) and amplitude due to the spacing between the transducers. The ambience is naturally included in the recording as well, but it is possible that additional microphones placed some distance away from the stage towards the back of the venue are used to capture the ambience as perceived by the audience. These ambience signals could later be added to the stereo mix at different levels to increase the perceived distance from the stage. There are many variations to this recording technique, like using cardioid or figure-of-eight microphones etc., but the main idea is that the mix tries to reproduce the performance as perceived by a hypothetical listener in the audience.

In both cases the main drawback of the stereo down-mix is that the presentation of the material over only two loudspeakers imposes a constraint on the spatial region that the can be spanned by the individual sources, and the ambience can only create a frontal image or "wall" that does not really surround the listener as it happens during a live performance. Had the sound engineer had more channels to work with, the mix would have been different and the results could have been significantly improved in terms of creating a realistic reproduction of the original performance.

Upmixing

In one embodiment, the strategy to up-mix a stereo signal into a multi-channel signal is based on predicting or guessing the way in which the sound engineer would have proceeded if she or he were doing a multi-channel mix. For example, in the direct/ambient approach the ambience signals recorded at the back of the venue in the live recording could have been sent to the rear channels of the surround mix to achieve the envelopment of the listener in the sound field. Or in the case of studio mix, a multi-channel reverberation unit could have been used to create this effect by assigning different reverberation levels to the front and rear channels. Also, the availability of a center channel could have helped the engineer to create a more stable frontal image for off-the-axis listening by panning the instruments among three channels instead of two.

To apply this strategy, we first undo the stereo mix and then remix the signals into a multi-channel mix. Clearly, this is a very ill-conditioned problem given the lack of specific information about the stereo mix. However, the novel signal processing algorithms and techniques described below are useful to achieve this.

A series of techniques are disclosed for extracting and manipulating information in the stereo signals. Each signal in the stereo recording is analyzed by computing its Short-Time Fourier Transform (STFT) to obtain its time-frequency representation, and then comparing the two signals in this new domain using a variety of metrics. One or many mapping or transformation functions are then derived based on the particular metric and applied to modify the STFT's of the input signals. After the modification has been performed, the modified transforms are inverted to synthesize the new signals.

FIG. 1 is a block diagram illustrating how upmixing is accomplished in one embodiment. Left and right channel signals are processed by STFT blocks 102 and 104. Processor 106 unmixes the signals and then upmixes the signals into a greater number of channels than the two input channels. Four output channels are shown for the purpose of illustration. Inverse STFT blocks 112, 114, 116, and 118 convert the signal for each channel back to the time domain.

Ambience Information Extraction and Signal Synthesis

In this section we describe a technique to extract the ambience of a stereo recording. The method is based on the assumption that the reverberation component of the recording, which carries the ambience information, is uncorrelated if we compare the left and right channels. This assumption is in general valid for most stereo recordings. The studio mix is intentionally made in this way so as to increase the perceived spaciousness. Live mixes sample the sound field at different spatial locations, thus capturing partially correlated room responses. The technique essentially attempts to separate the time-frequency elements of the signals which are uncorrelated between left and right channels from the direct-path components (i.e. those that are maximally correlated), and generates two signals which contain most of the ambience information for each channel. As we describe later, these ambience signals are sent to the rear channels in the direct/ambient up-mix system.

Our ambience extraction method utilizes the concept that, in the short-time Fourier Transform (STFT) domain, the correlation between left and right channels across frequency bands will be high in time-frequency regions where the direct component is dominant, and low in regions dominated by the reverberation tails. Let us first denote the STFT's of the left $S_L(t)$ and right $S_R(t)$ stereo signals as $S_L(m,k)$ and $S_R(m,k)$ respectively, where m is the short-time index and k is the frequency index. We define the following short-time statistics $$\Phi_{LL}(m,k)=\Sigma S_L(n,k)\cdot S_L^*(n,k), \quad (1a)$$

$$\Phi_{RR}(m,k)=\Sigma S_R(n,k)\cdot S_R^*(n,k), \quad (1b)$$

$$\Phi_{LR}(m,k)=\Sigma S_L(n,k)\cdot S_R^*(n,k), \quad (1c)$$

where the sum is carried over a given time interval n (to be defined later) and * denotes complex conjugation. Using these statistical quantities we define the inter-channel short-time coherence function as $$\Phi(m,k)=|\Phi_{LR}(m,k)|\cdot[\Phi_{LL}(m,k)\cdot\Phi_{RR}(m,k)]^{-1/2}. \quad (2)$$

The coherence function $\Phi$(m,k) is real and will have values close to one in time-frequency regions where the direct path is dominant, even if the signal is amplitude-panned to one side. In this respect, the coherence function is more useful than a correlation function. The coherence function will be close to zero in regions dominated by the reverberation tails, which are assumed to have low correlation between channels. In cases where the signal is panned in phase and amplitude, such as in the live recording technique, the coherence function will also be close to one in direct-path regions as long as the window duration of the STFT is longer than the time delay between microphones.

Audio signals are in general non-stationary. For this reason the short-time statistics and consequently the coherence function will change with time. To track the changes of the signal we introduce a forgetting factor $\lambda$ in the computation of the cross-correlation functions, thus in practice the statistics in (1) are computed as:

$$\Phi_{ij}(m,k)=\lambda\Phi_{ij}(m-1,k)+(1-\lambda)S_i(m,k)\cdot S_j^*(m,k). \quad (3)$$

Given the properties of the coherence function (2), one way of extracting the ambience of the stereo recording would be to multiply the left and right channel STFTs by $1-\Phi$(m,k) and to reconstruct (by inverse STFT) the two time domain ambience signals $a_L$(t) and $a_R$(t) from these modified transforms. A more general form that we propose is to weigh the channel STFT's with a non-linear function of the short-time coherence, i.e.

$$A_L(m,k)=S_L(m,k)M[\Phi(m,k)] \quad (4a)$$

$$A_R(m,k)=S_R(m,k)M[\Phi(m,k)], \quad (4b)$$

where $A_L$(m,k) and $A_R$(m,k) are the modified, or ambience transforms. The behavior of the non-linear function M that we desire is one in which the low coherence values are not modified and high coherence values above some threshold are heavily attenuated to remove the direct path component. Additionally, the function should be smooth to avoid artifacts. One function that presents this behavior is the hyperbolic tangent, thus we define M as:

$$M[\Phi(m,k)]=0.5(\mu_{max}-\mu_{min})tanh\{\sigma\pi(\Phi_o-\Phi(m,k))\}+0.5(\mu_{max}+\mu_{min}) \quad (5)$$

where the parameters $\mu_{max}$ and $\mu_{min}$ define the range of the output, $\Phi_o$ is the threshold and $\sigma$ controls the slope of the function. In general the value of $\mu_{max}$ is set to one since we do not wish to enhance the non-coherent regions (though this could be useful in other contexts). The value of $\mu_{min}$ determines the floor of the function and it is important that this parameter is set to a small value greater than zero to avoid spectral-subtraction-like artifacts.

Figure 2:
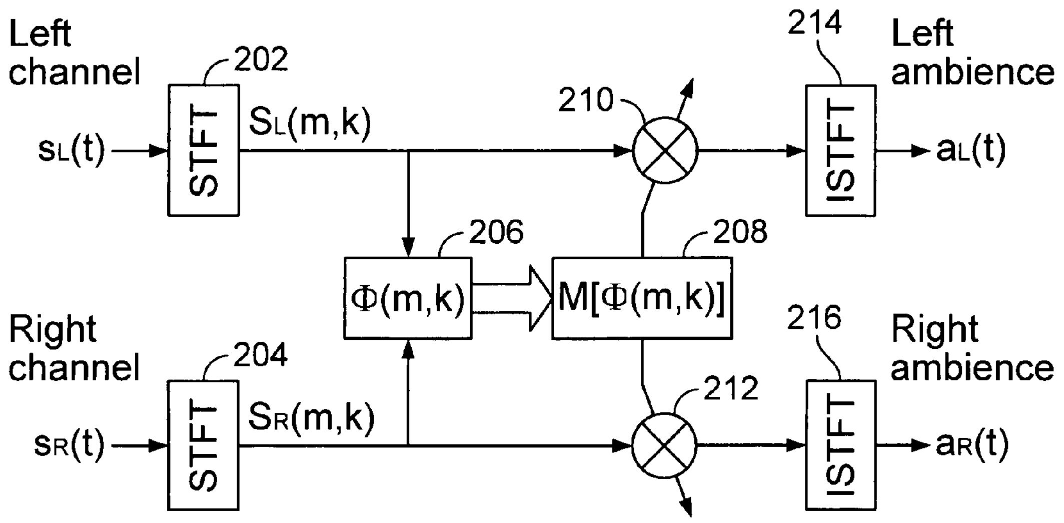
FIG. 2 is a block diagram illustrating the ambience signal extraction method.

FIG. 2 is a block diagram illustrating the ambience signal extraction method. The inputs to the system are the left and right channel signals of the stereo recording, which are first transformed into the short-time frequency domain by STFT blocks 202 and 204. The parameters of the STFT are the window length N, the transform size K and the stride length L. The coherence function is estimated in block 206 and mapped to generate the multiplication coefficients that modify the short-time transforms in block 208. The coefficients are applied in multipliers 210 and 212. After modification, the time domain ambience signals are synthesized by applying the inverse short-time transform (ISTFT) in blocks 214 and 216. Illustrated below are values of the different parameters used in one embodiment in the context of a 2-to-5 multichannel system.

Panning Information Estimation

In this section we describe another metric used to compare the two stereo signals. This metric allows us to estimate the panning coefficients, via a panning index, of the different sources in the stereo mix. Let us start by defining our signal model. We assume that the stereo recording consists of multiple sources that are panned in amplitude. The stereo signal with $N_s$ amplitude-panned sources can be written as $$s_L(t)=\Sigma_i(1-\alpha_i)s_i(t) \text{ and } S_R(t)=\Sigma_i\alpha_i s_i(t), \text{ for } i=1, \ldots, N_s. \quad (6)$$

where $\alpha_1$ are the panning coefficients. Since the time domain signals corresponding to the sources overlap in amplitude, it is very difficult (if not impossible) to determine which portions of the signal correspond to a given source, not to mention the difficulty in estimating the corresponding panning coefficients. However, if we transform the signals using the STFT, we can look at the signals in different frequencies at different instants in time thus making the task of estimating the panning coefficients less difficult.

Again, the channel signals are compared in the STFT domain as in the method described above for ambience extraction, but now using an instantaneous correlation, or similarity measure. The proposed short-time similarity can be written as $$\Psi(m,k)=2|S_L(m,k)\cdot S_R^*(m,k)|[|S_L(m,k)|^2+|S_R(m,k)|^2]^{-1}, \quad (7)$$

we also define two partial similarity functions that will become useful later on:

$$\Psi_L(m,k)=|S_L(m,k)\cdot S_R^*(m,k)|\cdot|S_L(m,k)|^{-2} \quad (7a)$$

$$\Psi_R(m,k)=|S_R(m,k)\cdot S_L^*(m,k)|\cdot|S_R(m,k)|^{-2}. \quad (7b)$$

The similarity in (7) has the following important properties. If we assume that only one amplitude-panned source is present, then the function will have a value proportional to the panning coefficient at those time/frequency regions where the source has some energy, i.e.

$$\Psi(m,k)=2\alpha S(m,k)\cdot(1-\alpha)S^*(m,k)|[|\alpha S(m,k)|^2+|(1-\alpha)S(m,k)|^2]^{-1},$$

$$=2(\alpha-\alpha^2)(\alpha^2+(1-\alpha)^2)^{-1}.$$

If the source is center-panned ($\alpha$=0.5), then the function will attain its maximum value of one, and if the source is panned completely to one side, the function will attain its minimum value of zero. In other words, the function is bounded. Given its properties, this function allows us to identify and separate time-frequency regions with similar panning coefficients. For example, by segregating time-frequency bins with a given similarity value we can generate a new short-time transform, which upon reconstruction will produce a time domain signal with an individual source (if only one source was panned in that location).

Figure 3A:
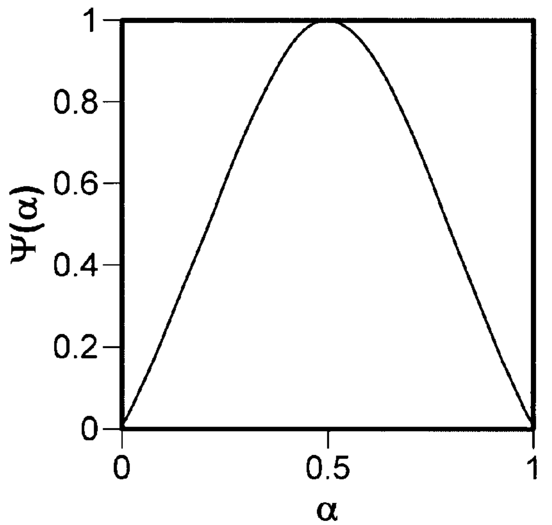
FIG. 3A is a plot of this panning function as a function of $\alpha$.

FIG. 3A is a plot of this panning function as a function of $\alpha$. Notice that given the quadratic dependence on $\alpha$, the function $\Psi$(m,k) is multi-valued and symmetrical about 0.5. That is, if a source is panned say at $\alpha$=0.2, then the similarity function will have a value of $\Psi$=0.47, but a source panned at $\alpha$=0.8 will have the same similarity value.

While this ambiguity might appear to be a disadvantage for source localization and segregation, it can easily be resolved using the difference between the partial similarity measures in (7). The difference is computed simply as $$D(m,k)=\Psi_L(m,k)-\Psi_R(m,k), \quad (8)$$

and we notice that time-frequency regions with positive values of D(m,k) correspond to signals panned to the left (i.e. $\alpha<0.5$), and negative values correspond to signals panned to the right (i.e. $\alpha>0.5$). Regions with zero value correspond to non-overlapping regions of signals panned to the center. Thus we can define an ambiguity-resolving function as $$D'(m,k)=1 \text{ if } D(m,k)>0 \text{ for all } m \text{ and } k$$

and $$D'(m,k)=-1 \text{ if } D(m,k)<=0 \text{ for all } m \text{ and } k. \quad (9)$$

Shifting and multiplying the similarity function by D'(m, k) we obtain a new metric, which is anti-symmetrical, still bounded but whose values now vary from one to minus one as a function of the panning coefficient, i.e.

$$\Gamma(m,k)=[1-\Psi(m,k)]\cdot D'(m,k), \quad (10)$$

Figure 3B:
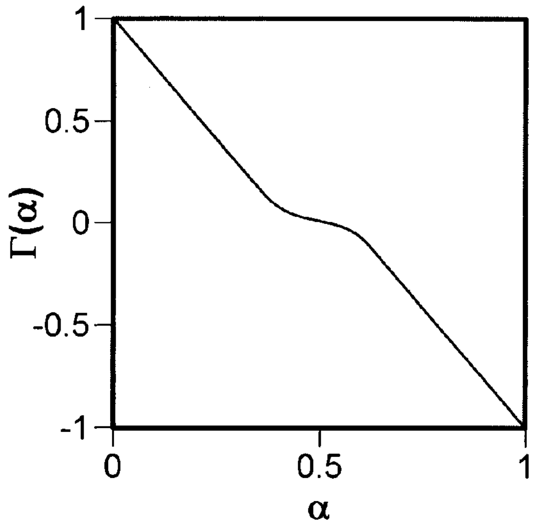
FIG. 3B is a plot of this panning function as a function of $\alpha$.

FIG. 3B is a plot of this panning function as a function of $\alpha$. In the following sections we describe the application of the short-time similarity and panning index to up-mix (re-panning), un-mix (separation) and source identification (localization). Notice that given a panning index we can obtain the corresponding panning coefficient given the one-to-one correspondence of the functions.

Two-Channel to N-Channel Up-mix

Here we describe the application of the panning index to the problem of up-mixing a stereo signal composed of amplitude-panned sources, into an N-channel signal. We focus on the particular case of two-to-three channel up-mix for illustration purposes, with the understanding that the method can easily be extended to more than three channels. The two-to-three channel up-mix case is also relevant to the design example of the two-to-five channel system described below.

In a stereo mix it is common that one featured vocalist or soloist is panned to the center. The intention of the sound engineer doing the mix is to create the auditory impression that the soloist is in the center of the stage. However, in a two-loudspeaker reproduction set up, the listener needs to be positioned exactly between the loudspeakers (sweet spot) to perceive the intended auditory image. If the listener moves closer to one of the loudspeakers, the percept is destroyed due to the precedence effect, and the image collapses towards the direction of the loudspeaker. For this reason (among others) a center channel containing the dialogue is used in movie theatres, so that the audience sitting towards either side of the room can still associate the dialogue with the image on the screen. In fact most of the popular home multi-channel formats like 5.1 Surround now include a center channel to deal with this problem. If the sound engineer had had the option to use a center channel, he or she would have probably panned (or sent) the soloist or dialogue exclusively to this channel. Moreover, not only the center-panned signal collapses for off-axis listeners. Sources panned primarily toward one side (far from the listener) might appear to be panned toward the opposite side (closer to the listener). The sound engineer could have also avoided this by panning among the three channels, for example by panning between center and left-front channels all the sources with spatial locations on the left hemisphere, and panning between center and right-front channels all sources with locations toward the right.

Figure 4:
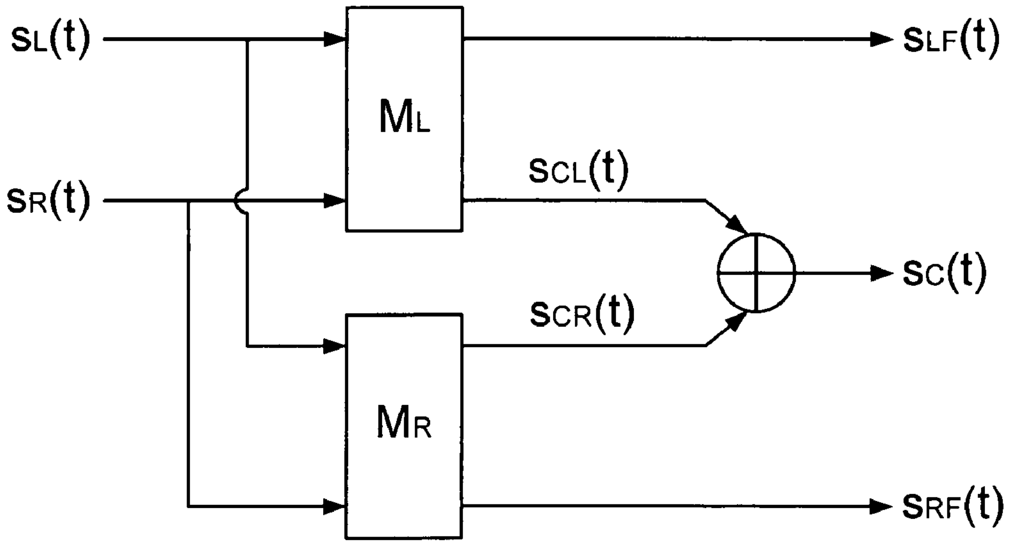
FIG. 4 is a block diagram illustrating a two-to-three channel upmix system.

To re-pan or up-mix a stereo recording among three channels we first generate two new signal pairs from the stereo signal. FIG. 4 is a block diagram illustrating a two-to-three channel upmix system. The first pair, $s_{LF}(t)$ and $s_{LC}(t)$, is obtained by identifying and extracting the time-frequency regions corresponding to signals panned to the left ($\alpha<0.5$) and modifying their amplitudes according to a mapping function $M_L$ that depends on the location of the loudspeakers. The mapping function should guarantee that the perceived location of the sources is preserved when the pair is played over the left and center loudspeakers. The second pair, $s_{RC}(t)$ and $s_{RF}(t)$, is obtained in the same way for the sources panned to the right. The center channel is obtained by adding the signals $s_{LC}(t)$ and $s_{RC}(t)$. In this way, sources originally panned to the left will have components only in the $s_{LF}(t)$ and $s_C(t)$ channels and sources originally panned to the right will have components only in the $s_C(t)$ and $s_{RF}(t)$ channels, thus creating a more stable image for off-axis listening. All sources panned to the center will be sent exclusively to the $s_C(t)$ channel as desired. The main challenge is to derive the mapping functions $M_L$ and $M_R$ such that a listener at the sweet spot will not perceive the difference between stereo and three-channel playback. In the next sections we derive these functions based on the theory of localization of amplitude panned sources.

Figure 5:
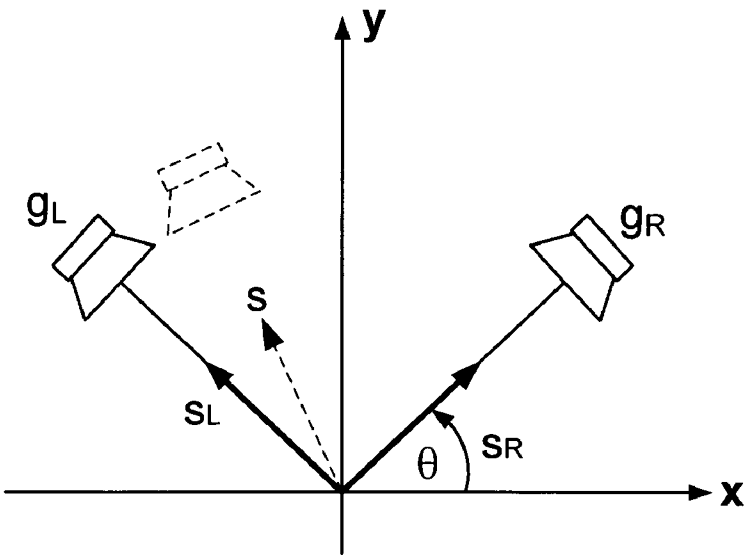
FIG. 5 is a diagram illustrating a coordinate convention for a typical stereo setup.
Figure 6:
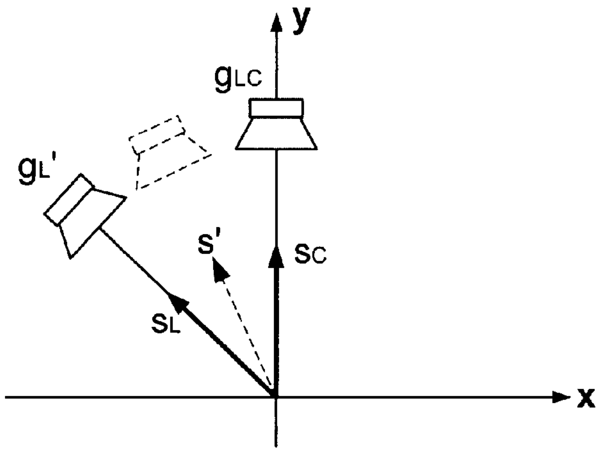
FIG. 6 is a diagram illustrating an up-mix technique based on a re-panning concept.

FIG. 5 is a diagram illustrating a coordinate convention for a typical stereo setup. The perceived location of a "virtual" source $s=[xy]^T$ is determined by the panning gains $g_L=(1-\alpha)$ and $g_R=\alpha$, and the position of the loudspeakers relative to the listener, which are defined by vectors $s_L=[x_L\ y_L]T$ and $s_R=[x_R\ y_R]^T$. FIG. 6 is a diagram illustrating a coordinate convention for a typical stereo setup. At low frequencies (f<700 Hz) the perceived location is obtained by vector addition as [6]:

$$s=\beta S\cdot g$$

where $$S=[s_L s_R]^T$$

and $$g=[g_L g_R]^T$$

The scalar $\beta=(g^T u)^{-1}$ with $u=[1\ 1]^T$, is introduced for normalization purposes and it is generally assumed to be unity for a stereo recording, i.e. $g_L=1-g_R$. At high frequencies (f>700 Hz) the apparent or perceived location of the source is determined by adding the intensity vectors generated by each loudspeaker (as opposed to amplitude vectors). The intensity vector is computed as $$s=\gamma S\cdot q$$

where where $$q=[g_L^2 g_R^2]^T$$

and the scalar $\gamma=(q^T u)^{-1}$ is introduced for power normalization purposes. Notice that there is a discrepancy in the perceived location in different frequency ranges.

FIG. 6 is a diagram illustrating an up-mix technique based on a re-panning concept. The right loudspeaker is moved to the center location $s_C$. In order to preserve the apparent location of the virtual source, i.e. s=s', the new panning coefficients g' need to be computed. If we write the new virtual source position at low frequencies, as $$s' = S' \cdot g'$$

where $$S' = [s_L s_C]^T$$

and $$g' = [g_L' g_{LC}]^T,$$

then the new panning coefficients are easily found by solving the following equation:

$$S \cdot g = S' \cdot g'.$$

If the angle between loudspeakers is not zero, then the solution to this equation exists and the new panning coefficients are found as $$g' = (S')^{-1} S \cdot g.$$

Notice that these gains do not necessarily add to one, thus a normalization factor $\beta' = (g'^T u)^{-1}$ needs to be introduced. Similarly, at high frequencies we obtain $$q' = (S')^{-1} S \cdot q,$$

where $$q' = [g_L'^2 g_{LC}^2]^T,$$

and the power normalization factor is computed as $\gamma' = (q'^T u)^{-1}$.

The re-panning algorithm then consists of computing the desired gains and modifying the original signals accordingly. For sources panned to the right, the same re-panning strategy applies, where the loudspeaker on the left is moved to the center.

In practice we do not have knowledge of the location (or panning coefficients) of the different sources in a stereo recording. Thus, the re-panning procedure needs to be applied blindly for all possible source locations. This is accomplished by identifying time-frequency bins that correspond to a given location by using the panning index $\Gamma$(m,k), and then modifying their amplitudes according to a mapping function derived from the re-panning technique described in the previous section.

We identify four time-frequency regions that, after modification, will be used to generate the four output signals $s_{LF}$(t), $s_{LC}$(t), $s_{RC}$(t) and $s_{RF}$(t) as shown in FIG. 4. Let us define two short-time functions $\Gamma_L$(m,k) and $\Gamma_R$(m,k) as $$\Gamma_L(m,k) = 1 \text{ for } \Gamma(m,k) < 0, \text{ and } \Gamma_L(m,k) = 0 \text{ for } \Gamma(m,k) >= 0$$

$$\Gamma_R(m,k) = 1 \text{ for } r(m,k) >= 0, \text{ and } \Gamma_R(m,k) = 0 \text{ for } \Gamma(m,k) < 0,$$

The four regions are then defined as:

$$S_{LL}(m,k) = S_L(m,k)\Gamma_L(m,k)$$

$$S_{LR}(m,k) = S_R(m,k)\Gamma_L(m,k)$$

$$S_{RL}(m,k) = S_L(m,k)\Gamma_R(m,k)$$

$$S_{RR}(m,k) = S_R(m,k)\Gamma_R(m,k),$$

where $S_L$(m,k) and $S_R$(m,k) are the STFT's of the left and right input signals, L and R respectively. The regions $S_{LL}$ and $S_{LR}$ contain the contributions to the left and right channels of the left-panned signals respectively, and the regions $S_{RR}$ and $S_{RL}$ contain the contributions to the right and left channels of the right-panned signals respectively. Each region is multiplied by a modification function M and the output signals are generated by computing the inverse STFT's of these modified regions as:

$$s_{LF}(t) = ISTFT\{S_{LL}(m,k) M_{LF}(m,k)\}$$

$$s_{LC}(t) = ISTFT\{S_{LR}(m,k) M_{LC}(m,k)\}$$

$$s_{RC}(t) = ISTFT\{S_{RL}(m,k) M_{RC}(m,k)\}$$

$$s_{RF}(t) = ISTFT\{S_{RR}(m,k) M_{RF}(m,k)\}$$

Figure 7A:
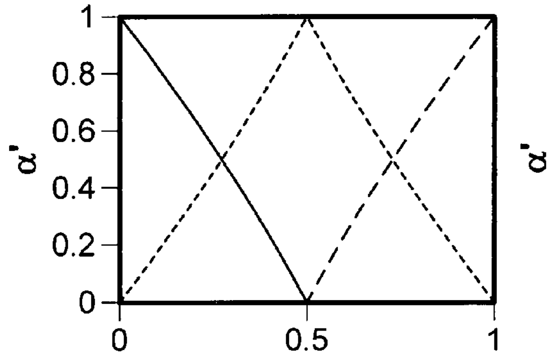
FIGS. 7A and 7B are plots of the desired gains for each output time frequency region as function of a assuming an angle $\theta$=60°.
Figure 7B:
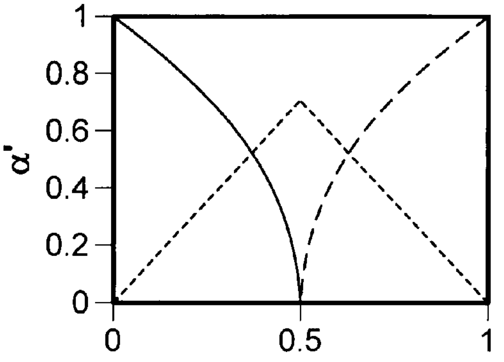

Thus the modification function in FIG. 4 are such that $M_L$ is equal to $\Gamma_L$(m,k)$M_{LF}$(m,k) for the left input signals and $\Gamma_L$(m,k)$M_{LC}$(m,k) for the right input signal, and similarly for $M_R$. To find the modification functions, we first find the desired gains for all possible input panning coefficients as described above. FIGS. 7A and 7B are plots of the desired gains for each output time frequency region as function of $\alpha$ assuming an angle $\theta=60°$.

Figure 7C:
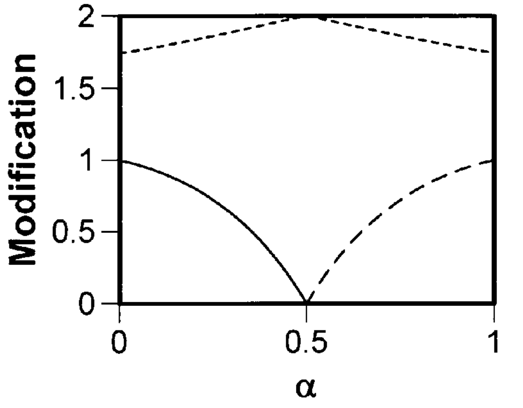
FIGS. 7C and 7D are plots of the modification functions.
Figure 7D:
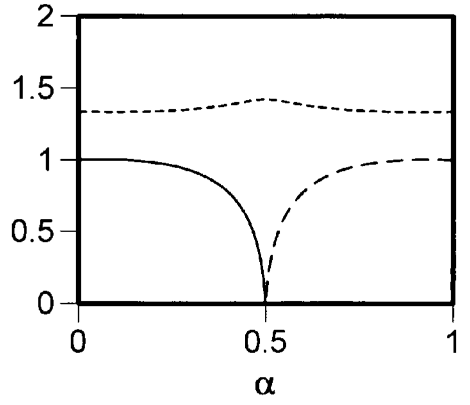
Figure 8A:
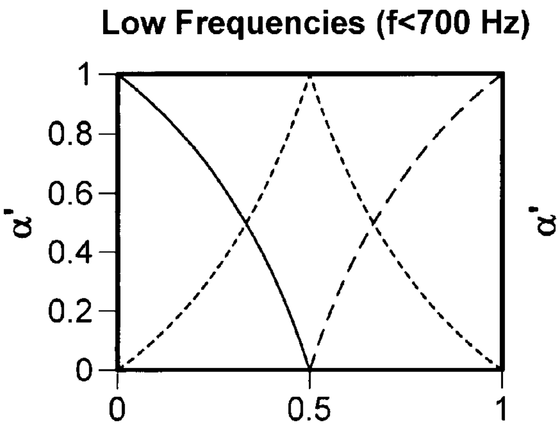
FIGS. 8A and 8B are plots of the desired gains for $\theta$=30°.
Figure 8B:
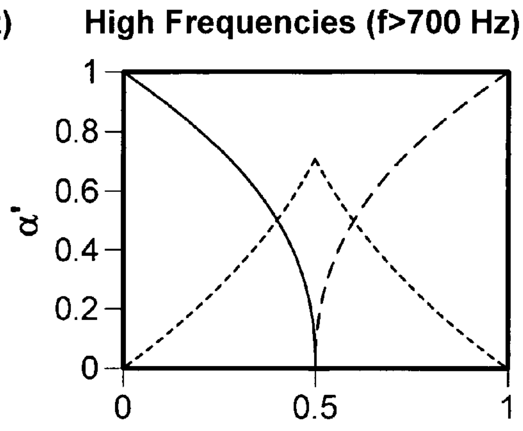
Figure 8C:
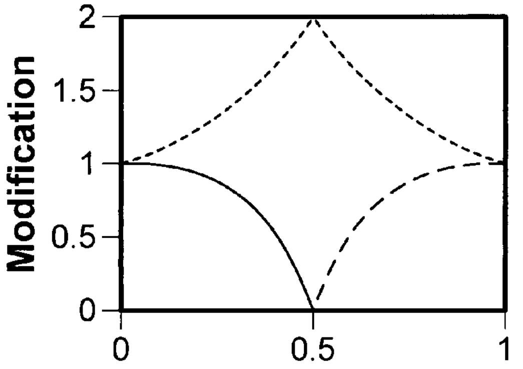
FIGS. 8C and 8D are plots of the corresponding modification functions for $\theta$=30°.
Figure 8D:
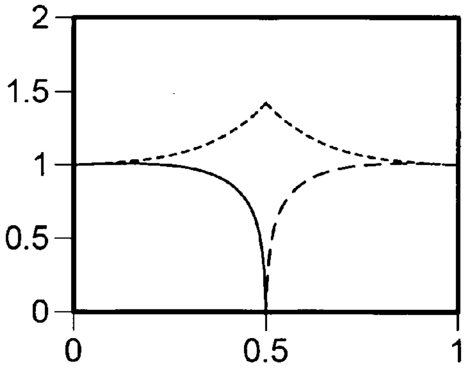

The modification functions are simply obtained by computing the ratio between the desired gains and the input gains. FIGS. 7C and 7D are plots of the modification functions. While a value of $\theta=60°$ is typical, it is likely that some listener will prefer different setups and the modification functions will greatly depend on this. FIGS. 8A and 8B are plots of the desired gains for $\theta=30°$. FIGS. 8C and 8D are plots of the corresponding modification functions for $\theta=30°$.

Source Un-Mix

Here we describe a method for extracting one or more audio streams from a two-channel signal by selecting directions in the stereo image. As we discussed in previous sections, the panning index in (10) can be used to estimate the panning coefficient of an amplitude-panned signal. If multiple panned signals are present in the mix and if we assume that the signals do not overlap significantly in the time-frequency domain, then the $\Gamma$(m,k) will have different values in different time-frequency regions corresponding to the panning coefficients of the signals that dominate those regions. Thus, the signals can be separated by grouping the time-frequency regions where $\Gamma$(m,k) has a given value and using these regions to synthesize time domain signals.

Figure 9:
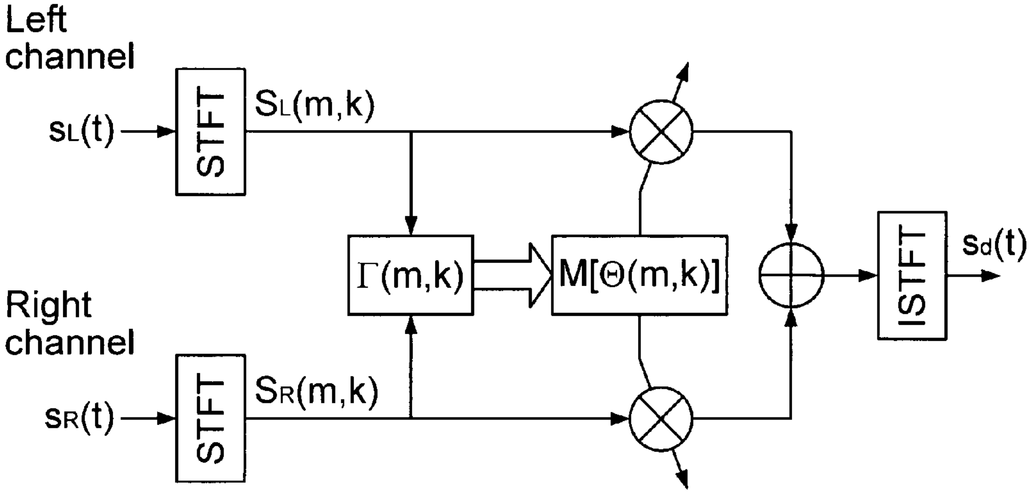
FIG. 9 is a block diagram illustrating a system for unmixing a stereo signal to extract a signal panned in one direction.

FIG. 9 is a block diagram illustrating a system for unmixing a stereo signal to extract a signal panned in one direction. For example, to extract the center-panned signal (s) we find all time-frequency regions for which the panning metric is zero and define a function $\Theta$(m,k) that is one for all $\Gamma$(m,k)=0, and zero otherwise. We can then synthesize a time domain function by multiplying $S_L$(m,k) and $S_R$(m,k) by $\Theta$(m,k) and applying the ISTFT. The same procedure can be applied to signals panned to other directions.

To avoid artifacts due to abrupt transitions and to account for possible overlap, instead of using a function $\Theta$(m,k) like we described above, we apply a narrow window centered at the panning index value corresponding to the desired panning coefficient. The width of the window is determined based on the desired trade-off between separation and distortion (a wider window will produce smoother transitions but will allow signal components panned near zero to pass).

To illustrate the operation of the un-mixing algorithm we performed the following simulation. We generated a stereo mix by amplitude-panning three sources, a speech signal $s_1$(t), an acoustic guitar $s_2$(t) and a trumpet $S_3$(t) with the following weights:

$$s_L(t) = 0.5 s_1(t) + 0.7 s_2(t) + 0.1 s_3(t) \text{ and } s_R(t) = 0.5 s_1(t) + 0.3 s_2(t) + 0.9 s_3(t).$$

We applied a window centered at Γ=0 to extract the center-panned signal, in this case the speech signal, and two windows at Γ=0.8 and Γ−0.27 (corresponding to α=0.1 and α=0.3) to extract the horn and guitar signals respectively. In this case we know the panning coefficients of the signals that we wish to separate. This scenario corresponds to applications where we wish to extract or separate a signal at a given location. Other applications that require identification of prominent sources are discussed in the next section.

Identification of Prominent Sources

Figure 10:
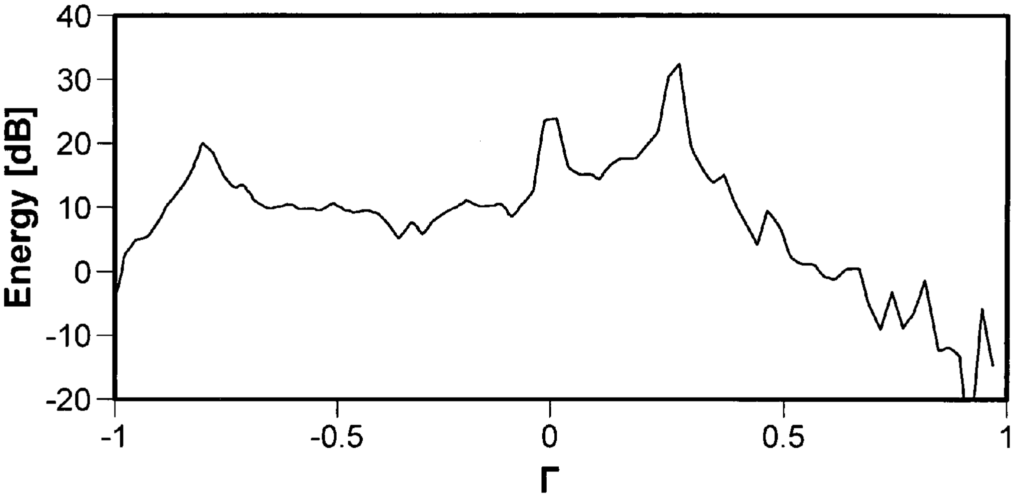
FIG. 10 is a plot of the average energy from an energy histogram over a period of time as a function of $\Gamma$ for a sample signal.

In this section we describe a method for identifying amplitude-panned sources in a stereo mix. In one embodiment, the process is to compute the short-time panning index Γ(m,k) and produce an energy histogram by integrating the energy in time-frequency regions with the same (or similar) panning index value. This can be done in running time to detect the presence of a panned signal at a given time interval, or as an average over the duration of the signal. FIG. 10 is a plot of the average energy from an energy histogram over a period of time as a function of Γ for a sample signal. The histogram was computed by integrating the energy in both stereo signals for each panning index value from −1 to 1 in 0.01 increments. Notice how the plot shows three very strong peaks at panning index values of Γ=−0.8, 0 and 0.275, which correspond to values of α=0.1, 0.5 and 0.7 respectively.

Once the prominent sources are identified automatically from the peaks in the energy histogram, the techniques described above can be used extract and synthesize signals that consist primarily of the prominent sources.

Multi-Channel Up-mixing System

In this section we describe the application of the ambience extraction and the source up-mixing algorithms to the design of a direct/ambient stereo-to-five channel up-mix system. The idea is to extract the ambience signals from the stereo recording using the ambience extraction technique described above and use them to create the rear or surround signals. Several alternatives for deriving the front channels are described based on applying a combination of the panning techniques described above.

Surround Channels

Figure 11:
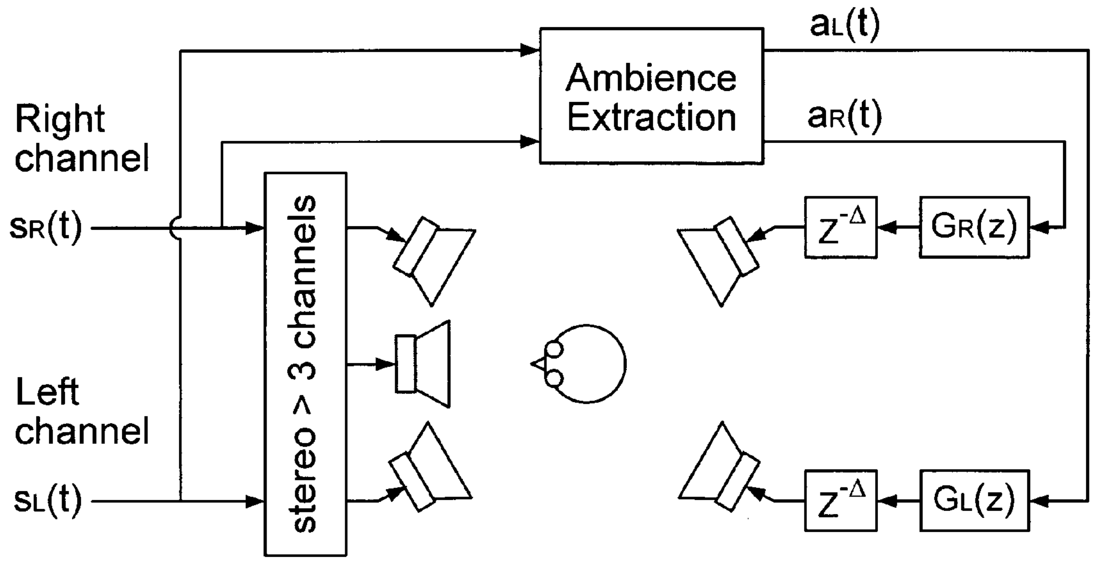
FIG. 11 is a diagram illustrating an up-mixing system used in one embodiment.

FIG. 11 is a diagram illustrating an up-mixing system used in one embodiment. The surround tracks are generated by first extracting the ambience signals as shown in FIG. 2. Two filters $G_L(Z)$ and $G_R(Z)$ are then used to filter the ambience signals. These filters are all-pass filters that introduce only phase distortion. The reason for doing this is that we are extracting the ambience from the front channels, thus the surround channels will be correlated with the front channels. This correlation might create undesired phantom images to the sides of the listener.

In one embodiment, the all-pass filters were designed in the time domain following the pseudo-stereophony ideas of Schroeder as described in J. Blauert, "Spatial Hearing." Hirzel Verlag, Stuttgart, 1974 and implemented in the frequency domain. The left and right filters are different, having complementary group delays. This difference has the effect of increasing the de-correlation between the rear channels. However, this is not essential and the same filter can be applied to both rear channels. Preferably, the phase distortion at low frequencies is kept to a small level to prevent bass thinning.

The rear signals that we are creating are simulating the tracks that were recorded with the rear microphones that collect the ambience at the back of the venue. To further decrease the correlation and to simulate rooms of different sizes, the rear channels are delayed by some amount Δ.

Front Channels

In some embodiments, the front channels are generated with a two-to-three channel up-mix system based on the techniques described above. Many alternatives exist, and we consider one simple alternative as follows.

Figure 12:
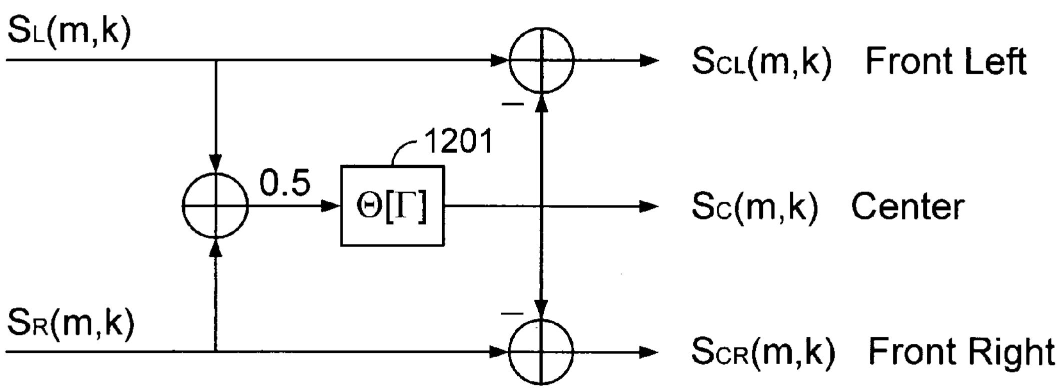
FIG. 12 is a diagram of a front channel upmix configuration.

The simplest configuration to generate the front channels is to derive the center channel using the techniques described above to extract the center-panned signal and sending the residual signals to the left and right channels. FIG. 12 is a diagram of such a front channel upmix configuration. Processing block 1201 represents a short-time modification function that depends on the non-linear mapping of the panning index. The signal reconstruction using the inverse STFT is not shown. This system is capable of producing a stable center channel for off-axis listening, and it preserves the stereo image of the original recording when the listener is at the sweet spot. However, side-panned sources will still collapse if the listener moves off-axis.

System Implementation

The system has been tested with a variety of audio material. The best performance so far has been obtained with the following parameter values:

| Parameter | Value | Description |
|---|---|---|
| N | 1024 | STFT window size |
| K | 2048 | STFT transform size |
| L | 256 | STFT stride size |
| λ | 0.90 | Cross-correlation forgetting factor |
| σ | 800 | Slope of mapping functions M |
| $\Phi_o$ | 0.15 | Breakpoint of mapping function M |
| $\mu_{min}$ | 0.05 | Floor of mapping functions M |
| Δ | 256 | Rear channel delay |
| $N_p$ | 15 | Number of complex conjugate poles of G(z) |

These parameters assume that the audio is sampled at 44.1 kHz. The configuration shown in FIG. 4 is used for the front channel up-mix.

In general, the ambience can be effectively extracted with using the methods described above. The ambience signals contain a very small direct path component at a level of around −25 dB. This residual is difficult to remove without damaging the rest of the signal. However, increasing the aggressiveness of the mapping function (increasing σ and decreasing $\Phi_o$ and $\mu_{min}$) can eliminate the direct path component but at the cost of some signal distortion. If $\mu_{min}$ is set to zero, spectral-subtraction-like artifacts tend to become apparent.

The parameters above represent a good compromise. While distortion is audible if the rear signals are played individually, the simultaneous playback of the four signals masks the distortion and creates the desired envelopment in the sound field with very high fidelity.

Although the foregoing invention has been described in some detail for purposes of clarity of understanding, it will be apparent that certain changes and modifications may be practiced within the scope of the appended claims. It should be noted that there are many alternative ways of implementing both the process and apparatus of the present invention. Accordingly, the present embodiments are to be considered as illustrative and not restrictive, and the invention is not to be limited to the details given herein, but may be modified within the scope and equivalents of the appended claims.

What is claimed is:

1. A method of separating a source in a stereo signal having a left channel and a right channel comprising:

transforming the stereo signal into a short-time transform domain;

computing a short-time similarity measure between the left channel and the right channel;

classifying time-frequency portions associated with the stereo signal having similar panning coefficients according to the short-time similarity measure;

segregating a selected one of the classified time-frequency portions associated with the stereo signal corresponding to the source; and reconstructing the source from the selected portions associated with the stereo signal.

2. A method of separating a source in a stereo signal as recited in claim 1 wherein a plurality of the classified time-frequency portions associated with the stereo signal are segregated.

3. A method of separating a source in a stereo signal as recited in claim 1 wherein the panning coefficients correspond to a panning location in the stereo signal.

4. A method of separating a source in a stereo signal as recited in claim 1 wherein a source location is identified based on a panning location.

5. A method of separating a source in a stereo signal as recited in claim 1 wherein the source is repanned into a multichannel signal based on a panning location.

6. A method of separating a source in a stereo signal as recited in claim 1 wherein the source is repanned into a N-channel signal based on a panning index.

7. A method of separating a source in a stereo signal as recited in claim 1 wherein the selected one of the classified time-frequency portions associated with the stereo signal corresponding to the source is segregated by selecting a direction in a stereo image.

8. A method of separating a source in a stereo signal as recited in claim 1 wherein the selected one of the classified time-frequency portions associated with the stereo signal corresponding to the source is segregated by selecting a prominent direction in a stereo image.

9. A source separation system for separating a source in a stereo signal having a left channel and a right channel comprising:

a processor configured to:

transform the stereo signal into a short-time transform domain;

compute a short-time similarity measure between the left channel and the right channel;

classify time-frequency portions associated with the stereo signal having similar panning coefficients according to the short-time similarity measure;

segregate a selected one of the classified time-frequency portions associated with the stereo signal corresponding to the source; and reconstruct the source from the selected portions associated with the stereo signal.

10. A source separation system as recited in claim 9 wherein a plurality of the classified time-frequency portions associated with the stereo signal are segregated.

11. A source separation system as recited in claim 9 wherein the panning coefficients correspond to a panning location in the stereo signal.

12. A source separation system as recited in claim 9 wherein a source location is identified based on a panning location.

13. A source separation system as recited in claim 9 wherein the source is repanned into a multichannel signal based on a panning location.

14. A source separation system as recited in claim 9 wherein the source is repanned into a N-channel signal based on a panning index.

15. A source separation system as recited in claim 9 wherein the selected one of the classified time-frequency portions associated with the stereo signal corresponding to the source is segregated by selecting a direction in a stereo image.

16. A source separation system as recited in claim 9 wherein the selected one of the classified time-frequency portions associated with the stereo signal corresponding to the source is segregated by selecting a prominent direction in a stereo image.

17. A computer program product for separating a source in a stereo signal having a left channel and a right channel, the computer program product being embodied in a computer readable medium and comprising computer instructions for:

transforming the stereo signal into a short-time transform domain;

computing a short-time similarity measure between the left channel and the right channel;

classifying time-frequency portions of the signals associated with the stereo signal having similar panning coefficients according to the short-time similarity measure;

segregating a selected one of the classified time-frequency portions associated with the stereo signal corresponding to the source; and reconstructing the source from the selected portions associated with the stereo signal.

18. A computer program product for separating a source in a stereo signal as recited in claim 17 wherein a plurality of the classified time-frequency portions associated with the stereo signal are segregated.

19. A computer program product for separating a source in a stereo signal as recited in claim 17 wherein the panning coefficients correspond to a panning location in the stereo signal.

20. A computer program product for separating a source in a stereo signal as recited in claim 17 wherein a source location is identified based on a panning location.

21. A computer program product for separating a source in a stereo signal as recited in claim 17 wherein the source is repanned into a multichannel signal based on a panning location.

22. A computer program product for separating a source in a stereo signal as recited in claim 17 wherein the source is repanned into a N-channel signal based on a panning index.

23. A computer program product for separating a source in a stereo signal as recited in claim 17 wherein the selected one of the classified time-frequency portions associated with the stereo signal corresponding to the source is segregated by selecting a direction in a stereo image.

24. A computer program product for separating a source in a stereo signal as recited in claim 17 wherein the selected one of the classified time-frequency portions associated with the stereo signal corresponding to the source is segregated by selecting a prominent direction in a stereo image.

25. A method of separating a source in a stereo signal having a left channel and a right channel comprising:

transforming the stereo signal into a short-time spectral transform domain;

computing a short-time similarity measure between the left channel and the right channel;

identifying time-frequency regions associated with the stereo signal having similar panning coefficients according to the short-time similarity measure;

segregating a selected one of the identified time-frequency regions corresponding to the source; and reconstructing the source from the selected time-frequency region.

26. A source separation system for separating a source in a stereo signal having a left channel and a right channel comprising:

a processor configured to:

transform the stereo signal into a short-time transform domain;

compute a short-time similarity measure between the left channel and the right channel;

identify time-frequency regions associated with the stereo signal having similar panning coefficients according to the short-time similarity measure;

segregate a selected one of the identified time-frequency regions corresponding to the source; and reconstruct the source from the selected time-frequency region.

27. A computer program product for separating a source in a stereo signal having a left channel and a right channel, the computer program product being embodied in a computer readable medium and comprising computer instructions for:

transforming the stereo signal into a short-time transform domain;

computing a short-time similarity measure between the left channel and the right channel;

identifying time-frequency regions associated with the stereo signal having similar panning coefficients according to the short-time similarity measure;

segregating a selected one of the identified time-frequency regions corresponding to the source; and reconstructing the source from the selected time-frequency region.

* * * * *